United States Patent
Lu et al.

(10) Patent No.: US 9,147,584 B2
(45) Date of Patent: Sep. 29, 2015

(54) ROTATING CURING

(75) Inventors: Jing Ruei Lu, Taipei (TW); Yu-Chih Liu, Taipei (TW); Ming-Chung Sung, Taichung (TW); Wei-Ting Lin, Taipei (TW); Chien-Kuo Chang, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/297,390

(22) Filed: Nov. 16, 2011

(65) Prior Publication Data

US 2013/0119565 A1    May 16, 2013

(51) Int. Cl.
*H01L 21/50* (2006.01)
*H01L 23/29* (2006.01)
*H01L 21/56* (2006.01)
*H01L 21/67* (2006.01)
*H01L 21/687* (2006.01)

(52) U.S. Cl.
CPC .......... *H01L 21/56* (2013.01); *H01L 21/67109* (2013.01); *H01L 21/68764* (2013.01); *H01L 21/563* (2013.01); *H01L 2924/0002* (2013.01)

(58) Field of Classification Search
CPC . H01L 21/56; H01L 21/67109; H01L 21/563; H01L 2924/0002
USPC ......... 257/E21.24, E21.04, E23.01, 795, 798; 438/198, 758, 694, 124, 126, 127
See application file for complete search history.

(56) References Cited

U.S. PATENT DOCUMENTS

| | | | |
|---|---|---|---|
| 2003/0001280 A1* | 1/2003 | Noguchi et al. | 257/774 |
| 2010/0260910 A1* | 10/2010 | Backus et al. | 426/523 |
| 2011/0209344 A1* | 9/2011 | Takahashi et al. | 29/852 |
| 2013/0017503 A1* | 1/2013 | De Ridder et al. | 432/18 |

FOREIGN PATENT DOCUMENTS

| TW | 200641178 | 12/2006 |
|---|---|---|
| WO | 2010026815 | 3/2010 |

OTHER PUBLICATIONS

Fan, L., et al., "Effect of Filler Setting of Underfill Encapsulant of Reliability Performance," 2001 International Symposium on Advanced Packaging Materials, pp. 218-223.

Huang, Y., et al., "Fill Pattern and Particle Distribution of Underfill Material," IEEE Transactions on Components and Packaging Technologies, Sep. 2004, vol. 27, No. 3, pp. 493-498.

Chen, C.-F., et al., "Dependence of Flip Chip Solder Reliability on Filler Settling," IEEE Transactions on Advanced Packaging, Nov. 2009, vol. 32, No. 4, pp. 711-719.

* cited by examiner

*Primary Examiner* — Hoa B Trinh
(74) *Attorney, Agent, or Firm* — Slater & Matsil, L.L.P.

(57) ABSTRACT

A system for and a method of curing a material is provided. A material, such as an underfill material, is rotated during a curing process. The curing system may include a chamber, a holder to support one or more workpieces, and a rotating mechanism. The rotating mechanism rotates the workpieces during the curing process. The chamber may include one or more heat sources and fans, and may further include a controller. The curing process may include varying the rotation speed, continuously rotating, periodically rotating, or the like.

19 Claims, 3 Drawing Sheets

ROTATING CURING

BACKGROUND

In typical packaging processes, a first structure is attached to a second structure, and an underfill material is placed between the first structure and the second structure. For example, a semiconductor chip or die may be attached to a package substrate using solder balls to physically and electrically connect the semiconductor chip to the packaging substrate. Underfill, which typically comprises a resin with a silica filler, is placed between the semiconductor chip and the packaging substrate to provide structural support and protection from environmental factors.

BRIEF DESCRIPTION OF THE DRAWINGS

For a more complete understanding of the present disclosure, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure. Throughout the various views and illustrative embodiments of the present disclosure, like reference numbers are used to designate like elements.

As will be discussed in greater detail below, disclosed embodiments utilize a rotating curing process in which a workpiece is rotated during at least a portion of the curing time. In particular, embodiments discussed herein are described in the context of curing an underfill material, wherein the underfill material comprises a resin with silica filler material. By rotating the workpiece, settling of the silica filler material is reduced or prevented. Other embodiments, however, may be utilized for other processes and/or materials.

Figure 1:
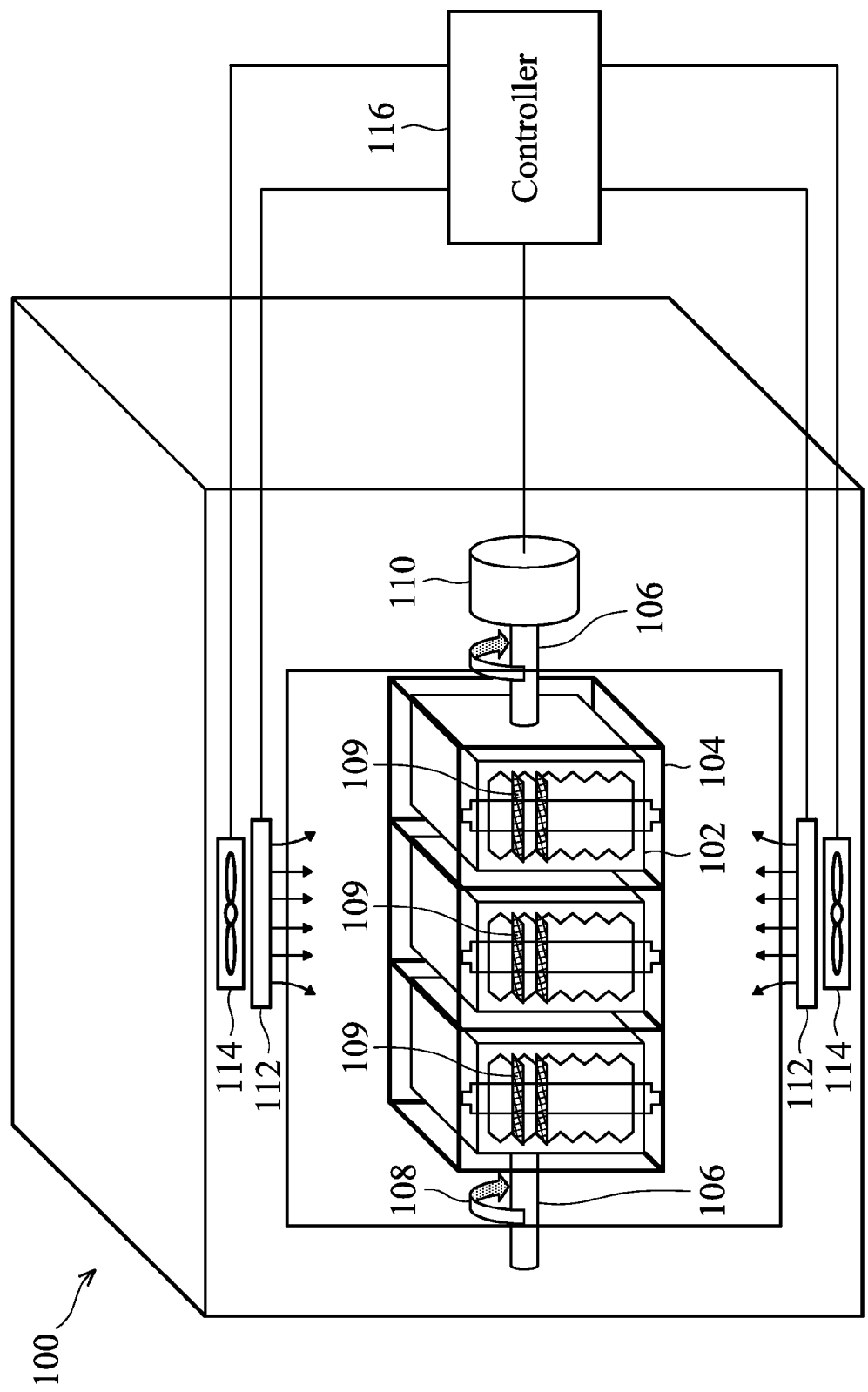
FIG. 1 illustrates a process chamber in accordance with an embodiment.

Referring first to FIG. 1, a curing chamber 100 is shown in accordance with an embodiment. As explained in greater detail below, in an embodiment the curing chamber 100 rotates as the structures cure, thereby preventing or reducing the separation of the curing material caused by gravitational forces. For example, underfill material may comprise a resin material with a silica filler material. By rotating the structures with the underfill material, the settling of the filler material is prevented or reduced.

The curing chamber 100 includes one or more cassettes 102 (three cassettes 102 are shown in FIG. 1 by way of example) coupled to rotate about an axis. For example, the cassettes 102 may be placed in a frame 104 coupled to a rotating mechanism. In the embodiment illustrated in FIG. 1, the rotating mechanism comprises a rod 106 rotatable about an axis, as illustrated by arrows 108, by a rotator, such as a motor 110. Each cassette 102 may hold one or more workpieces 109, wherein each workpiece 109 may be any desirable structure. For example, the workpiece 109 may comprise integrated circuit dies soldered to a substrate (e.g., an interposer, wafer, packaging substrate, another die, or the like) and underfill placed between the integrated circuit dies and the substrate.

The curing chamber 100 may include one or more heat sources, such as heat sources 112 and fans 114, which aid in the circulation of the air about the cassettes 102. Two heat sources 112 and two fans 114 (one each on the top and bottom of the curing chamber 100) are shown for illustrative purposes only. As such, the curing chamber 100 may include more or fewer heat sources and/or fans to achieve the desired heating characteristics for the curing chamber for an intended application.

FIG. 1 also illustrates a controller 116 communicatively coupled to the motor 110. The controller 116 may be used to control, for example, the rotation speed, the rotation time period, the heat sources, the fans, and the like. For example, the controller 116 may control the motor 110 to vary the speeds and time of the rotation as described below with reference to FIGS. 2 and 3.

Figure 2:
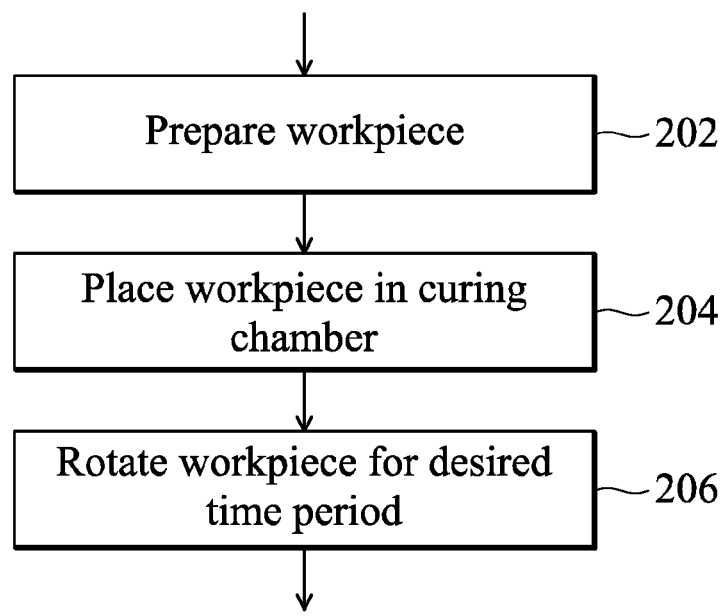
FIG. 2 is a flow chart illustrating steps of a process in accordance with an embodiment.

FIG. 2 is a flow chart that illustrates a curing process in accordance with an embodiment. The process begins is step 202, wherein the workpiece is prepared. For example, in an embodiment in which the curing chamber 100 is being utilized to cure an underfill material, preparation of the workpiece 109 may include preparing a die, securing the die to a substrate (e.g., a wafer, another die, an interposer, or the like), and placing underfill material between the die and the substrate.

Thereafter, in step 204 the workpiece 109 is placed in the curing chamber 100. Then, in step 206, the workpiece 109 is rotated for a desired rotation time period at a desired temperature. In an embodiment, the workpiece 109 is placed in the curing chamber in a horizontal position such that during the rotation time period a rotation axis passes through or is parallel to the surfaces between which the underfill is placed. For example, if the underfill is placed between a die and a substrate, the rotation axis may pass through or is parallel to the surface of the substrate on which the die is placed. In this manner, the underfill may have less of a tendency to flow out of between die and the substrate than if the workpiece 109 were to be placed vertically.

In an embodiment such as that illustrated in FIG. 2, the workpiece 109 is rotated at a constant rate, such as between less than about 1 rotation/minute to about 10 rotations/minute. It is believed that the rate of rotation may be adjusted based upon the curing temperature. For example, if the curing temperature is 120° C., then a slower rotation speed may be used than when the curing temperature is 180° C. It is also believed that the rotation speed may be adjusted based upon the curing time. For example, if a quick curing time is used, then a higher rotation speed may be used as compared to a longer curing time. Further, the rotation speed may be adjusted based upon the type of underfill. For example, a thicker underfill may be able to handle a faster rotation speed than a thinner underfill due in part to the centrifugal forces.

In another embodiment, the workpiece 109 is continuous rotated, but is rotated at a varying rate as compared to a constant rate. For example, the curing chamber 100 may start rotating the workpiece 109 at a slow rate and increase the rotation rate during processing. The increase may be constantly increasing, increased periodically (e.g., step increases), or a combination thereof. Similarly, in another example, the curing chamber may start rotating the workpiece 109 at a relatively fast rate and decrease the rotation rate during processing, such as constantly decreasing the rotation rate, decreasing the rotation rate periodically (e.g., step decreases), or a combination thereof.

By rotating the workpiece 109 during curing, it is believed that a more even composition of the underfill is achieved. As discussed above, the underfill is generally a mixture of materials, such as a mixture of resin and silica filler. If the workpiece is not rotated, the silica filler may tend to settle during curing. This settling may cause variations in material characteristics of the underfill material, e.g., the area of the underfill that includes more silica filler may have different characteristics than the area of the underfill that has less silica filler. For example, characteristics such as the coefficient of thermal expansion (CTE), the modulus value, and the transition temperature of the underfill material may vary depending upon the amount of settling of the silica filler.

Figure 3:
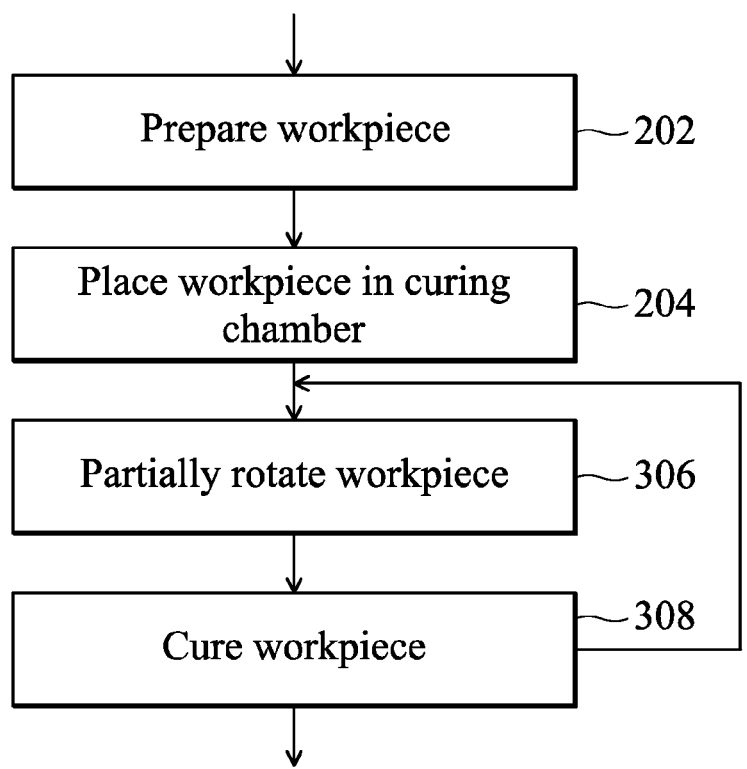
FIG. 3 is a flow chart illustrating steps of a process in accordance with another embodiment.

FIG. 3 is a flow chart that illustrates another curing process in accordance with another embodiment. In this embodiment, steps 202 and 204 may be similar to the like processes discussed above with reference to FIG. 2. Steps 306 and 308 describe an alternative process to step 206 of FIG. 2.

Referring first to step 306, after placing the workpiece 109 in the curing chamber 100, the workpiece 109 is cured in a first position for first time period. Thereafter, in step 308, the workpiece 109 is partially rotated, such as being rotated about 180°. The processing then returns to step 306 wherein the process of curing for a second time period and flipping the workpiece 109 is repeated for the desired curing time.

The time period for curing in step 306 may be constant for each rotation, or may vary between rotations. For example, in some embodiments, time spent in a fixed position for curing may increase as the total curing time progresses. In this embodiment, the workpiece 109 would be rotated at shorter time intervals in the beginning of the curing process and rotated at relatively longer time intervals in the later stages of the curing process. In another embodiment, the workpiece 109 would be rotated at longer time intervals in the beginning of the curing process and rotated at relatively shorter time intervals in the later stages of the curing process.

It is also believed that achieving a more even distribution of the silica filler and more consistent material characteristics may reduce or prevent structural defects in the bonding. For example, it is believed that embodiments such as those described herein may reduce bump cracking and or solder extrusions, particularly in regions in which the silica filler is missing.

It should also be noted that the temperature, or other parameters such as pressure, ambient, and the like, may be altered during the curing period.

In an embodiment, a method comprising is provided. The method comprises placing a workpiece into a chamber, the chamber being configured to rotate the workpiece; and rotating the workpiece while processing the workpiece.

In another embodiment, a processing device is provided. The processing device comprises a chamber; a rotator; and a rotating workpiece holder mounted within the chamber and coupled to the rotator, the rotator configured to rotate the rotating workpiece holder.

In yet another embodiment, a device is provided. The device comprises a first substrate; a second substrate coupled to the first substrate; and an underfill positioned between the first substrate and the second substrate, the underfill having a uniform composition.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
    placing a workpiece into a chamber, the chamber being configured to rotate the workpiece, the workpiece having a major surface and a minor surface, the major surface being larger than the minor surface, wherein the workpiece includes a first substrate coupled to a second substrate; and
    rotating the workpiece while performing a processing step on the workpiece such that the major surface of the workpiece is parallel to an axis of rotation of the workpiece.

2. The method of claim 1, wherein the chamber is a curing chamber and the processing step includes heating the workpiece.

3. The method of claim 1, where the step of rotating comprises continuously rotating the workpiece.

4. The method of claim 3, further comprising varying a rotation rate of the workpiece during the processing step.

5. The method of claim 1, wherein the rotating is performed periodically.

6. The method of claim 5, further wherein a time period between rotations vary.

7. The method of claim 1, further comprising placing an underfill material between the first substrate and the second substrate.

8. The method of claim 7, wherein the underfill comprises a silica filler.

9. A processing device comprising:
    a chamber;
    a rotator;
    a rotating workpiece holder mounted within the chamber and coupled to the rotator, the rotator configured to rotate the rotating workpiece holder such that a major surface of a workpiece in the workpiece holder is parallel to an axis of rotation of the workpiece, the major surface being perpendicular to a minor surface of the workpiece; and
    a plurality of individual cassettes, wherein the rotating workpiece holder is configured to hold the plurality of individual cassettes, each individual cassette configured to hold a plurality of workpieces.

10. The processing device of claim 9, further comprising a controller communicatively coupled to the rotator.

11. The processing device of claim 10, wherein the controller is configured to control the rotator to periodically rotate the rotating workpiece holder during processing.

12. The processing device of claim 9, further comprising one or more heat sources in the chamber.

13. The processing device of claim 9, further comprising one or more fans in the chamber.

14. The processing device of claim 10, wherein the controller is configured to control the rotator to continuously rotate the rotating workpiece holder during processing.

15. The processing device of claim 10, wherein the controller varies a speed at which the rotator rotates the rotating workpiece.

16. The processing device of claim 10, further comprising a heat source communicatively coupled to the controller, the controller setting a temperature for the heat source.

17. A method comprising:
    placing a workpiece into a chamber, the chamber being configured to rotate the workpiece, the workpiece being a semiconductor device; and
    rotating the workpiece at varying speeds between completion of an on cycle and initiation an off cycle while processing the workpiece.

18. The method of claim 17, wherein the chamber is a curing chamber and the rotating the workpiece at varying speeds while processing the workpiece comprises rotating the workpiece at varying speeds while heating the workpiece.

19. The method of claim 17, wherein the rotating is performed periodically.

\* \* \* \* \*